United States Patent [19]

Matthews

[11] Patent Number: 5,338,925
[45] Date of Patent: Aug. 16, 1994

[54] APPARATUS FOR SIMULTANEOUSLY DETECTING A PLURALITY OF DISCRETE LASER MODULATION FREQUENCIES HAVING CIRCUITRY FOR BACKGROUND RADIATION CANCELING

[75] Inventor: William F. Matthews, Wilton, Conn.

[73] Assignee: Hughes Aircraft Company, Los Angeles, Calif.

[21] Appl. No.: 47,331

[22] Filed: Mar. 17, 1993

[51] Int. Cl.5 .............................................. H01J 40/14
[52] U.S. Cl. ................................. 250/214 B; 307/311; 307/520
[58] Field of Search ..................... 250/214 B; 307/311, 307/491, 520, 521, 522

[56] References Cited

U.S. PATENT DOCUMENTS

| | | | |
|---|---|---|---|
| 4,143,264 | 3/1979 | Gilbert et al. | 250/214 B |
| 4,366,378 | 12/1982 | Simons et al. | 250/214 B |
| 4,945,255 | 7/1990 | Gamgee et al. | 250/214 B |

*Primary Examiner*—David C. Nelms
*Assistant Examiner*—Stephone B. Allen
*Attorney, Agent, or Firm*—Michael W. Sales; Wanda K. Denson-Low

[57] ABSTRACT

An apparatus (10) includes at least one detector circuit (12) having circuitry (14) for canceling background radiation, a signal amplifier stage (16) adapted to receive and amplify a signal from the detector circuit (12) and a plurality of discrete frequency detection circuits (18), the discrete frequency detection circuits having a common input (20) and a plurality of outputs (22).

19 Claims, 2 Drawing Sheets

APPARATUS FOR SIMULTANEOUSLY DETECTING A PLURALITY OF DISCRETE LASER MODULATION FREQUENCIES HAVING CIRCUITRY FOR BACKGROUND RADIATION CANCELING

BACKGROUND OF THE INVENTION

The present invention generally relates to an apparatus for simultaneously detecting a plurality of discrete laser modulation frequencies and, in particular relates to one such apparatus having a detector circuit with means for canceling background radiation.

In modern warfare many weapons rely on laser beams to acquire and track targets. The use of lasers in this fashion has numerous advantages among which is the difficulty of the target to detect the fact that it has been targeted. Hence, there is considerable time and expense being dedicated to laser detection. It is known that, because of the nature of lasers, laser targeting systems either operate at only a limited number of frequencies or, due to the modulation techniques conventionally employed, the frequencies are difficult to change once a weapon is in production.

At the present time, laser detection systems require expensive passive and analog circuitry, as well as digital signal processing equipment. The main disadvantage of conventional systems is the expense of obtaining high performance in the presence of background light radiation. For example, since most lasers operate at visible light frequencies, the detection of the presence of a laser in daylight is difficult due to the presence of sunlight. Sunlight causes a very strong background against which to discriminate a laser. To accomplish such discrimination with a sufficient signal to noise ratio to be useful, expensive optical components and circuitry and techniques, such as those cited above, are required.

Consequently, it is highly desirable to provide a circuit that overcomes the difficulties of laser light discrimination from background radiation using relatively inexpensive circuit components and techniques.

SUMMARY OF THE INVENTION

Accordingly, it is one object of the present invention to provide an apparatus for simultaneously detecting a plurality of discrete laser modulation frequencies that substantially completely overcomes the above recited drawbacks of the prior art.

This object is accomplished, at least in part, by an apparatus for simultaneously detecting a plurality of discrete laser modulation frequencies having a detector circuit with means for canceling background radiation.

Other objects and advantages will become apparent to those skilled in the art from the following detailed description of the invention read in conjunction with the appended claims and the drawings attached hereto.

BRIEF DESCRIPTION OF THE DRAWINGS

The drawing, not drawn to scale, includes.

DETAILED DESCRIPTION OF THE INVENTION

Figure 1A:
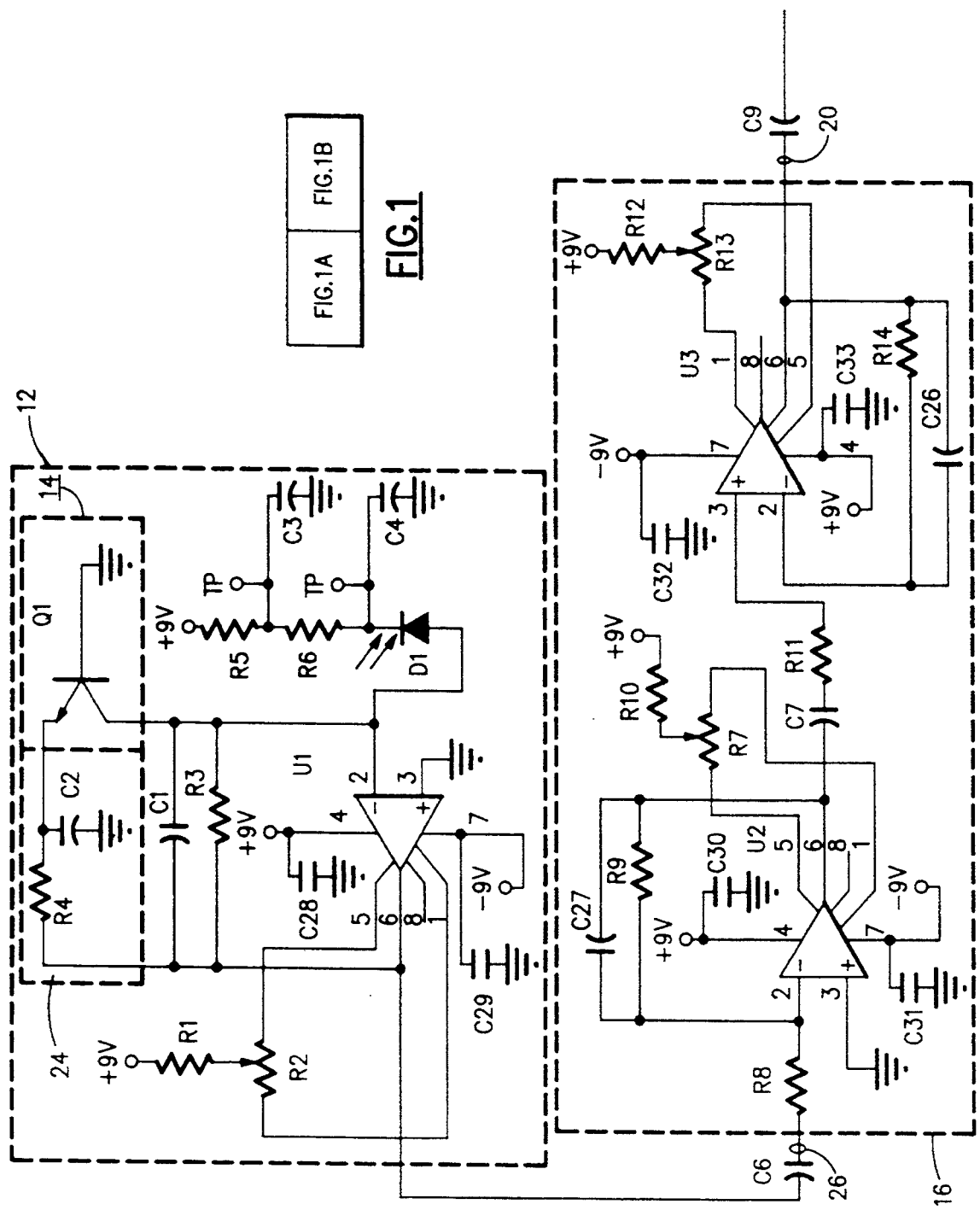
FIG. 1, shown as FIGS. 1A and 1B for clarity, is a circuit diagram of an apparatus for simultaneously detecting a plurality of discrete laser modulation frequencies embodying the principles of the present invention.
Figure 1B:
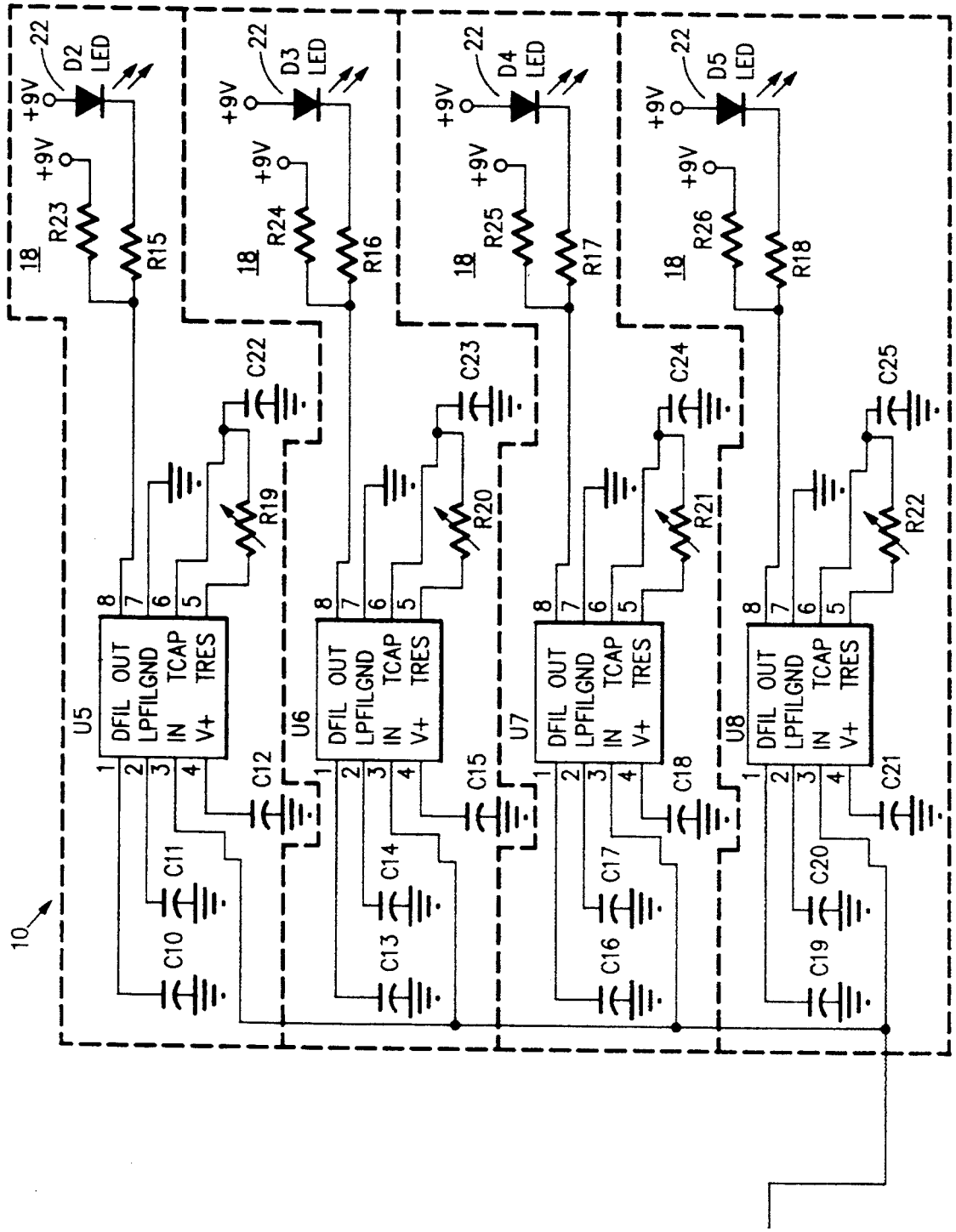

An apparatus, generally indicated at 10 in FIG. 1 and embodying the principles of the present invention, includes at least one detector circuit 12 having means 14 for canceling background radiation, a signal amplifier stage 16 adapted to receive and amplify a signal from the detector circuit 12 and a plurality of discrete frequency detection circuits 18, the discrete frequency detection circuits having a common input 20 and a plurality of outputs 22.

In the preferred embodiment, the detector circuit 12 includes a photodetector D1 that converts light illuminating the photodetector D1 to a representative electronic signal containing all of the modulation frequencies of the illuminating light. In addition, the photodetector D1 is directly coupled to a signal preamplifier U1. Further, the detector circuit 12 includes the means 14 for canceling background radiation. Preferably, the means 14 is a negative current feedback circuit that cancels the detector background current. In this embodiment, the means 14 includes a transistor Q1 having the collector thereof connected to the junction of the photodetector D1 and the input of the preamplifier U1.

Operationally, under conditions of low background current, the transistor Q1 represents a high impedance and the photodetector D1 operates at optimum signal to noise ratio into the low dynamic impedance at the input of the preamplifier U1 as established by the wideband feedback path via resistor R3. As the background increases and the photodetector background current becomes significant, the transistor Q1 diverts the low frequency background current from the input of the preamplifier U1 with minimal effect on the operating point of the preamplifier U1. Hence, saturation of the preamplifier U1 is prevented. An RC filter 24 connected to the emitter of the transistor Q1 prevents the cancellation in the laser modulation bands of interest. The detector circuit 12 thus, outputs a signal, on the output line 26 thereof, containing all of the discrete laser modulation frequencies with a relatively high signal to noise ratio.

The output line 26 acts as a signal input connection to the signal amplifier stage 16. In this embodiment, the signal amplifier stage 16 includes first and second serially connected signal amplifiers, U2 and U3, respectively. The amplifiers, U2 and U3, amplify the signal from the detector circuit 12 and provide an output that is functionally acceptable to the common input 20 of the discrete frequency detection circuits 18. The signal provided includes all of the laser modulation frequencies.

The signal provided to the common input 20 is equally distributed in parallel to a plurality of signal detection circuits, U5, U6, U7, and U8, each being programmed, or tuned, for a preselected center frequency and a preselected bandwidth. In the embodiment shown, the signal detection circuits, U5, U6, U7, and U8 are conventional phase locked loop tone decoders. The bandwidth for each signal detection circuit, U5, U6, U7, and U8, is set by the capacitors connected between ground and pins 1 and 2 of each signal detection circuit. Specifically, capacitors C10 and C11 for the signal detection circuit U5, capacitors C13 and C14 for the signal detection circuit U6, capacitors C16 and C17 for signal detection circuit U7, and capacitors C19 and C20 for the signal detection circuit U8. The center frequency of each of the signal detection circuits, U5, U6, U7, and U8 is set by the RC network connected to pins 5 and 6 thereof. Specifically, the resistor R19 and the capacitor C22 for signal detection circuit U5, the resistor R20 and the capacitor C23, the resistor R21 and the capacitor C24 for the signal detection circuit U7, and the resistor R22 and the capacitor C25 for the signal detection circuit U8.

Preferably, the output of each signal detection circuit, U5, U6, U7, and U8 is used as a logic level signal for interfacing with a computer processor, or some other logic device. Alternatively the output of each signal detection circuit, U5, U6, U7, and U8 may be directly connected to an output display device which can either be an audio device or a visual device, or both. In the particular embodiment shown, the output from the signal detection circuits U5, U6, U7, and U8 are connected to light emitting diodes, D2, D3, D4, and D5, respectively. Hence, when a signal having one or more of the modulation frequencies for which the signal detection circuits, U5, U6, U7, and U8 are set is present at the common input 20, the respective light emitting diode, or diodes, D2, D3, D4, and D5, will be illuminated. As a result, the operator of the equipment having the apparatus 10 installed will immediately be informed not only that a laser is illuminating the equipment but also be informed of the modulation frequency of the laser.

It will be understood that all of the signal detection circuits, U5, U6, U7, and U8 may be integrated on a single semiconductor chip. It will also be understood that although the apparatus 10 is shown in FIG. 1 to include four discrete signal detection circuits any desired number of such circuits could be used. Further, in an instance where it is unnecessary to simultaneously inform the operator of all laser modulation frequencies a single signal detection circuit may be provided and the modulation frequencies scanned by varying the center frequency and bandwidth components thereof.

In the specific embodiment of the apparatus 10 shown in FIG. 1, the resistor components are set forth hereinafter: R1, R2, R7, R10, R12 and R13=200 thousand ohms; R3=5.1 Megohms; R4=3.3 thousand ohms; R5 and R6=510 ohms; R8 and R11=3 thousand ohms; R9=300 thousand ohms; R14=30 thousand ohms; R15, R16, R17, and R18 are each 900 ohm; R19, R20, R21, and R22 are 10 thousand ohm variable resistors; R23, R24, R25 and R26 are each 20 thousand ohm. The capacitors component values are as follows: C1=4.7 picofarad; C2=7 microfarad; C3=220 micro farad; C4=0.1 micro farad; C6, C7, C12, C13, C15, C18, C21, C25, C28, C29, C30, C31, C32, C33 are each 0.47 micro farad; C9=0.047 micro farad; C10=0.33 micro farad; C11=0.15 farad; C14=0.27 micro farad; C16=0.68 micro farad; C17=0.33 micro farad; C19=1.5 micro farad; C20=0.56 micro farad; C22=0.012 micro farad; C23=0.018 micro farad; C24=0.022 micro farad; and C26 and C27 are each equal to 4.7 picofarad.

In the specific embodiment shown in FIG. 1 the photodetector D1 is an EG&G No. C30810 or equivalent; the transistor Q1 is a 2N222A; the amplifiers, U1, U2, and U3, are National Semiconductor LM318 of equivalent; the integrated circuit amplifiers U5, U6, U7, and U8 are Signetics NE567 tone decoder/phase-locked loop or equivalents.

Although the present invention has been described herein with respect to one or more specific embodiments it will be understood that other arrangements and configurations may also be implemented without departing from the spirit and scope hereof. Hence the present invention is deemed limited only by the appended claims and the reasonable interpretation thereof.

What is claimed is:

1. An apparatus for simultaneously detecting a plurality of discrete laser modulation frequencies; said apparatus comprising:
   a laser detector circuit having means for canceling background radiation, said laser detector circuit generating an output signal containing all laser modulation frequencies of an illuminating light;
   a signal amplifier stage, said signal amplifier stage being adapted to receive and amplify said output signal generated by said laser detector circuit and provide an amplified output signal; and
   at least one discrete frequency detection circuit, each said discrete frequency detection circuit including means for providing an output signal in response to the presence of a preselected laser modulation frequency in said amplified output signal.

2. The apparatus as claimed in claim 1, wherein said laser detection circuit comprises: a photodetector, said photodetector being of the type for generating an electronic signal output containing all modulation frequencies of the illuminating light.

3. The apparatus as claimed in claim 2, further comprising: a signal preamplifier having aid electronic signal output from said photodetector as the input thereto, said signal preamplifier being serially connected to said photodetector.

4. The apparatus as claimed in claim 3, wherein said background radiation cancellation means is a transistor having the collector thereof connected at the junction of said photodetector and said preamplifier.

5. The apparatus as claimed in claim 4, wherein said background radiation cancellation means further includes an RC network connected between the output of said preamplifier and the emitter of said transistor.

6. The apparatus as claimed in claim 5 wherein said signal amplifier stage includes first and second serially connected signal amplifiers, said output of said signal amplifier stage containing all modulation frequencies of the illuminating light.

7. The apparatus as claimed in claim 6 wherein said at least one discrete frequency detection circuit is connected to said output of said signal amplifier stage.

8. The apparatus as claimed in claim 7 wherein said at least one discrete frequency detection circuit includes a plurality of discrete frequency detection circuits connected in parallel.

9. The apparatus as claimed in claim 8 wherein each one of said plurality of discrete frequency detection circuits is a phase locked loop tone decoder.

10. The apparatus as claimed in claim 9 wherein each said phase locked loop tone decoder has a different laser modulation center frequency.

11. The apparatus as claimed in claim 10 wherein each said phase locked loop tone decoder has a different bandwidth.

12. The apparatus as claimed in claim 9 wherein each said phase locked loop tone decoder includes an output connected to an output display device.

13. The apparatus as claimed in claim 12 wherein said output display devices are light emitting diodes.

14. The apparatus as claimed in claim 9 wherein each said phase locked loop tone decoder includes an output connected to a logic level interface of a computer processor.

15. The apparatus as claimed in claim 1 wherein said signal amplifier stage includes first and second serially connected signal amplifiers, said output of said signal amplifier stage containing all modulation frequencies of the illuminating light.

16. The apparatus as claimed in claim 1 wherein said at least one discrete frequency detection circuit includes a plurality of discrete frequency detection circuits connected in parallel.

17. The apparatus as claimed in claim 15 wherein each one of said plurality of discrete frequency detection circuits is a phase locked loop tone decoder.

18. The apparatus as claimed in claim 1 wherein each said signal detection circuit includes an output connected to an output display device.

19. The apparatus as claimed in claim 17 wherein said output display devices are light emitting diodes.

* * * * *